United States Patent [19]

Pines et al.

[11] Patent Number: 4,968,939
[45] Date of Patent: Nov. 6, 1990

[54] METHOD AND APPARATUS FOR MEASURING THE NMR SPECTRUM OF AN ORIENTATIONALLY DISORDERED SAMPLE

[75] Inventors: Alexander Pines, Berkeley, Calif.; Ago Samoson, Tallinn, U.S.S.R.

[73] Assignee: The Regents of the University of California, Berkeley, Calif.

[21] Appl. No.: 371,977

[22] Filed: Jun. 27, 1989

Related U.S. Application Data

[63] Continuation-in-part of Ser. No. 227,729, Aug. 3, 1988, Pat. No. 4,899,111.

[51] Int. Cl.$^5$ .............................................. G01R 33/20
[52] U.S. Cl. ..................................................... 324/321
[58] Field of Search ................ 324/300, 307, 318, 321

[56] References Cited

U.S. PATENT DOCUMENTS 4,301,410 11/1981 Wind et al. .......................... 324/321
4,352,066 9/1982 Kendrick et al. .................... 324/321

OTHER PUBLICATIONS

L. J. Azevedo, "Rotating Sample Holder . . . ", Rev. Sci. Instrum. 50(2), pp. 231-232, Feb. 1979.

Primary Examiner—Hezron E. Williams
Assistant Examiner—Kevin D. O'Shea
Attorney, Agent, or Firm—McCubbrey, Bartels, Meyer & Ward

[57] ABSTRACT

An improved NMR probe and method are described which substantially improve the resolution of NMR measurements made on powdered or amorphous or otherwise oreintationally disordered samples. The apparatus mechanically varies the orientation of the sample such that the time average of two or more sets of spherical harmonic functions is zero.

6 Claims, 5 Drawing Sheets

METHOD AND APPARATUS FOR MEASURING THE NMR SPECTRUM OF AN ORIENTATIONALLY DISORDERED SAMPLE

This application is a continuation-in-part of U.S. patent application Ser. No. 227,729, filed Aug. 3, 1988, which issued as U.S. Pat. No. 4,899,111 on Feb. 6, 1990.

BACKGROUND OF THE INVENTION

The present invention relates to the measurement of nuclear magnetic resonance (NMR) spectra and, in particular, to the NMR spectra of polycrystalline and/or amorphous solids.

Since its discovery in 1946, Nuclear Magnetic Resonance (NMR) has become a powerful analytical tool in studies of various liquid and solid materials. It is non-invasive and gives results which can be readily interpreted. The measured chemical shifts can be immediately associated with model structural units of the substance under study. In addition, relaxation rates provide information about molecular motions. Characteristic resonance frequencies of magnetic nuclei lie in a convenient radio-frequency (RF) range and can be detected with well-known electronic techniques.

An NMR experiment may be described as follows. Nuclei, because of their charge and nuclear spin, may be regarded as bar magnets having magnetic moments. These magnetic moments are randomly oriented in the absence of external forces. When placed in an external magnetic field, these nuclei have discrete spin states. A quantized amount of energy is associated with each such spin state. The energy of each such state depends on the nuclear magnetic moment of the nuclei being studied and the magnetic field in the vicinity of the nucleus in question. This magnetic field is the superposition of the external magnetic field and the magnetic fields generated by nearby electrons and nuclei. Hence, measurements of the energy levels associated with each of the spin states can provide information about the environment of the nuclei being studied.

An NMR measurement is made by determining the energy difference between nuclear spin states. In order to accomplish this, a sample of the material in question is placed in an external magnetic field and excited by applying a second, oscillating magnetic field in a direction perpendicular to the first steady field. This is accomplished by applying oscillating RF energy across a coil. The second magnetic field is created by a pulsing current in this coil. This second field causes transitions between nuclear spin states whose energies are determined by the first field. The energy absorbed by the nuclei during such an excitation or emitted thereby after such an excitation provides information on the differences in energy between the various spin states.

The accuracy of NMR measurements depends upon the physical form of the sample being studied. Highly accurate chemical shift determinations and separation of NMR lines are possible for liquid samples due to the random tumbling and rapid reorientation of sample molecules in solution. This rapid reorientation effectively causes the surroundings of the resonating nuclei to appear isotropic on the time scale of the NMR experiment.

If polycrystalline, powdery, glassy solids, or the like, are studied, however, the observable lines are broadened due to different orientations of particles with respect to the static magnetic field. Anisotropic line broadening has traditionally rendered high-resolution work impossible with this type of sample.

Various methods have been employed to reduce the amount of line broadening observed for solid samples. For example, techniques in which crystalline materials are oriented in a particular direction with respect to the external magnetic field are known to the prior art. Unfortunately, such methods are impractical in many cases, since many solids cannot be obtained in single crystalline form nor oriented in a uniform direction throughout the material. In fact, many samples for which NMR spectra are desired exist only as powders or amorphous solids.

In the prior art, line broadening difficulties can be partially overcome by using magic angle spinning (MAS). According to this technique, the sample is rotated rapidly at an angle of 54.7 degrees with respect to the external magnetic field, i.e., the magic angle. This spinning removes so-called first order line broadening caused by such factors as chemical shift anisotropy, secular dipolar interactions, and first order quadrupole interactions. As a result, line widths on the order of 100 Hz are typically observed for non-quadrupole nuclei.

Although the resultant line widths are significantly narrower than those obtained without MAS, they are still far broader than those obtained with liquid samples. Typically, line widths of 0.2 Hz are observed for liquids.

In the case of quadrupole nuclei, the line broadening is even worse. Line widths of quadrupole nuclei are determined primarily by second order quadrupole interactions, and are on the order of several KHz or more for light nuclei in strong magnetic fields. Although MAS narrows the lines of quadrupole nuclei, it does not completely correct for the line broadening.

In a co-pending application (U.S. Ser. No. 227,729) an apparatus and method for reducing the line broadening from such second order interactions is disclosed. The apparatus in question reorients the sample during the measurements such that the average values of certain generalized spherical harmonic functions are zero. This improved method and apparatus requires that the sample be moved in a time which is small compared to the NMR relaxation time for the sample being measured. An apparatus for providing this rapid reorientation of the sample is expensive to manufacture.

Furthermore, it is not always possible to provide this type of rapid reorientation. For example, if superconducting samples are to be studied, the samples must be maintained at very low temperatures. Providing rapid sample reorientation at such temperatures is difficult.

In addition, the spectra obtained when the sample is rapidly reoriented often contain side-bands which complicate the interpretation of the spectra. For example, one apparatus for providing the reorientation in question utilizes a combination of two rotors in which the sample is caused to spin about a first axis at a first angular velocity while the first axis is caused to sweep out a cone with a second angular velocity. Each line in the NMR spectrum is modulated by these motions. These modulations give rise to additional lines, referred to as side-bands. These side-bands complicate the interpretation of spectra.

In more complex NMR experiments, the sample is subjected to a number of RF pulses which must be applied with reference to the sample position. Hence, apparatuses which rapidly reorient the sample must include means for tracking the position of the sample at all times. Such tracking means increase the cost and complexity of the apparatuses in question.

Broadly, it is an object of the present invention to provide an improved apparatus for measuring nuclear magnetic properties of solids.

It is a further object of the present invention to provide an NMR apparatus with improved resolution for structural determinations of powdered or amorphous or otherwise orientationally disordered solid samples.

It is yet another object of the present invention to provide an apparatus and method which allows NMR spectra to be measured even when the sample cannot be moved in a time which is short compared to the NMR relaxation time.

It is a still further object of the present invention to provide an apparatus and method which does not result in the introduction of side-bands into the measured spectra.

It is yet another object of the present invention to provide an apparatus and method which does not require a tracking means for determining the position of the sample.

These and other objects of the present invention will become apparent to those skilled in the art from the following detailed description of the invention and the accompanying drawings.

SUMMARY OF THE INVENTION

The present invention comprises an apparatus and method for measuring the NMR spectrum of a sample. The sample is placed in a magnetic field in a sample holder which can move with respect to the magnetic field direction, the orientation of the sample being specified by a set of angles, $\Omega$, measured with reference to the direction of the magnetic field. During the course of each NMR measurement, the orientation of the sample assumes a succession of discrete orientations specified by sets of angles, $\Omega_i$, where i runs from 1 to N, the time spent at the orientation specified by $\Omega_i$ being $T_i$. The sets of angles, $\Omega_i$, and dwell times $T_i$ are chosen such that $$\sum_{i=1}^{N} T_i Y_{pm}(\Omega_i) = 0 \quad \text{for } m = -p \text{ to } +p$$

and $$\sum_{i=1}^{N} T_i Y_{qm}(\Omega_i) = 0 \quad \text{for } m = -q \text{ to } +q.$$

Here, $Y_{pm}$ and $Y_{qm}$ are generalized spherical harmonic functions of order p and q, respectively, p and q being greater than 0 and different from each other.

DETAILED DESCRIPTION OF THE INVENTION

Under rapid isotropic reorientation, anisotropic nuclear interactions are averaged away. Rotation and diffusion motions in liquids and collisions in gases are examples of naturally occurring molecular motions which provide such averaging. Nuclear spins in solids or partially oriented samples, in contrast, are locked in constraining or partially constraining environments and do not enjoy the benefit of rapid isotropic orientational randomization. As a result, the NMR spectra of powdered solids exhibit broad, and frequently featureless, lines reflecting the effects of the anisotropies of the spin interactions.

Consider an orientationally disordered sample which is comprised of particles or regions (sets of particles) which are small crystals, fragments thereof, or molecules. In the NMR experiment, the sample is placed in a magnetic field having a predetermined direction. The frequencies of electromagnetic energy absorbed or emitted by each particle will depend on the particle's orientation relative to the magnetic field. Since the sample contains a continuous range of particle orientations, a broad spectrum is observed. The broadness of this spectrum limits the usefulness of such measurements.

Ideally, one would like to measure properties with solid samples similar to those measured in liquid samples, namely, the NMR frequencies of each particle or region averaged over all possible orientations of that particle or region. Such an average is independent of the particle size and constitutes a sensitive measure of the underlying physical properties of the material being measured.

In principle, one can accomplish this by melting or dissolving the sample and measuring the sample in the liquid state. However, many samples of interest can not be studied in this manner.

Magic angle spinning provides a partial averaging motion analogous to the natural motions that provide averaging in liquids and gases. The apparent first order anisotropy of the nuclei in a rapidly spinning disordered sample depends on the angle between the direction of the external magnetic field and the axis about which the sample is spun. By choosing the proper angle, improvements in the observed line widths are observed.

Figure 1:
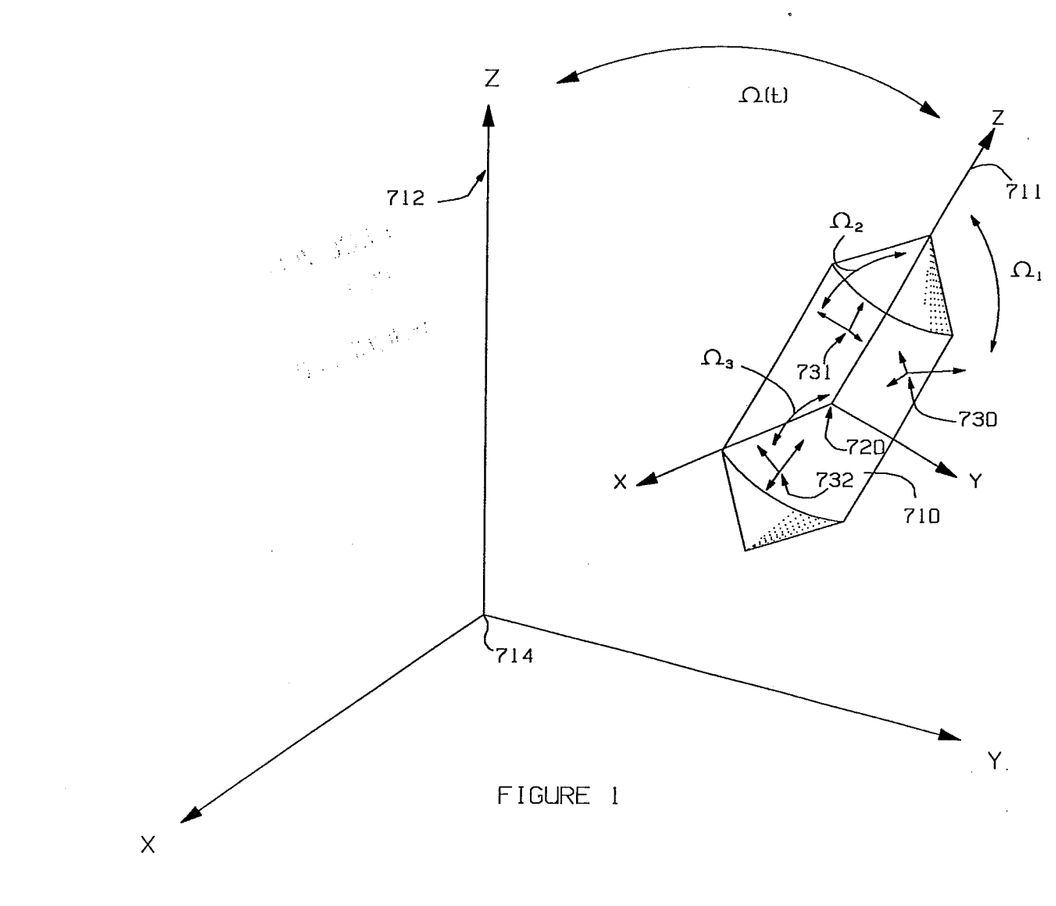
FIG. 1 illustrates the orientation of particles in a sample holder in a magnetic field.

The manner in which the magic angle is chosen may be most easily understood with reference to FIG. 1. A sample is placed in a sample holder 710 which is located in a magnetic field having the direction shown at 712. The magnetic field defines a first coordinate system having axes shown at 714. The sample holder may be described with reference to a second coordinate system shown at 720. At any given time, the angular relationship of this coordinate system with respect to the first coordinate system 714 may be specified by giving the values of a set of angles $\Omega$. As sample holder 710 moves $\Omega$ changes with time. The manner in which $\Omega$ changes is specified by a function, $\Omega(t)$.

Within the sample holder, each particle or region of the sample has its own orientation which may be specified by a coordinate system associated with that particle or region. Exemplary particle coordinate systems are shown at 730-732. Each of the particle coordinate systems may be specified with respect to coordinate system 720 by giving the values of a set of angles $\Omega$. Particle coordinate system 730 is specified by $\Omega_1$, particle coordinate system 731 is specified by $\Omega_2$, and particle coordinate system 732 is specified by $\Omega_3$. It should be noted that $\Omega_1$, $\Omega_2$, and $\Omega_3$ are constants whose values are fixed once the sample is placed in sample holder 710.

Each set of angles, $\Omega$, consists of three angles, $\alpha$, $\Theta$, and $\phi$, which specify the angles between the two relevant coordinate systems.

It may be shown that, to a good approximation, the NMR frequencies emitted by the ith particle or region due to secular interactions up to rank L in the sample are given by $$\omega(\Omega_i,\Omega(t)) = \omega_0 + \sum_{l=1}^{L} \sum_{m=-l}^{l} A_{lm}(\Omega_i) Y_{lm}(\Omega(t)) \quad (1)$$

Here, the values of $A_{lm}$ depend on $\Omega_i$ and the chemical properties of the sample. The functions $Y_{lm}$ are the generalized spherical harmonic functions of rank l. For each rank l, there is a set of $2l+1$ such functions. That is, m takes on the values from $-l$ to $+l$. These functions depend only on two angles, the angle between the sample axis and the magnetic field direction and the angle between the projection of the magnetic field direction in the xy-plane and the x-axis of the sample related frame.

For the purposes of this discussion, $$D_i = \sum_{l=1}^{L} \sum_{m=-l}^{l} A_{lm} Y_{lm}(\Omega(t)) \quad (2)$$

will be referred to as the frequency dispersion due to secular interactions contributed by the ith particle or region in the sample. The measured NMR signal is the sum of the signals emitted by each of the particles. Each particle contributes a constant set of frequencies $\omega_0$ to the spectrum and a frequency dispersion, $D_i$, which is different for each particle, since each particle has a different orientation.

The frequencies $\omega_0$ depend only on the chemical properties of the sample. Ideally, it is these frequencies that one would like to measure. However, these frequencies are masked by frequency dispersion terms which are different for different particles or regions. These terms give rise to the broad, often featureless, spectra observed for orientationally disordered samples.

If sample holder 710 moves, the NMR spectrum will be averaged over the orientations realized during the movement. The measured spectrum for the ith particle is the average of the spectrum given in Eq. (1), the average being taken over the range of $\Omega(t)$ angles realized by the sample motion. Hence, the contribution of the ith particle becomes $$<\omega(\Omega_i,\Omega(t))> = \omega_0 + \sum_{l=1}^{L} \sum_{m=-l}^{l} A_{lm}(\Omega_i)<Y_{lm}(\Omega(t))> \quad (3)$$

Here, $<\ >$ denotes the average value of the quantity enclosed by the brackets.

In the case of liquids or gases, the naturally occurring motions provide the averaging motions. In these cases, the average values of all of the $Y_{lm}$'s are zero. Hence, the measured spectrum, $<\omega(\Omega_i, \Omega(t))>$, is equal to $\omega_0$.

If the sample is rotated about an axis inclined at an angle $\Theta$ with respect to the magnetic field, it may be shown that $$<Y_{lm}(\Omega(t))> = 0, \text{ for } m \neq 0 \quad (4)$$

$$<Y_{l0}(\Omega(t))> = P_l(\cos\theta)$$

where $P_l(\cos \Theta)$ is the Legendre polynomial of order l. In the case of samples having predominantly first order line broadening, only the $Y_{20}$ term is significant. Hence, if $\Theta$ is chosen such that $$P_2(\cos \Theta) = 0 \quad (5)$$

the line broadening is removed. The $\Theta$ value for which this condition is met is 54.7 degrees, the magic angle.

The use of magic angle spinning leads to a significant reduction in observed line widths only when the $Y_{20}$ term in Eq. (3) is the major contributor to the frequency dispersion. This is the case for NMR measurements based, for example, on $C^{13}$, $Si^{29}$, and $P^{31}$.

Unfortunately, many cases of interest do not satisfy this constraint. For example, both the $Y_{20}$ and $Y_{40}$ terms are significant for $B^{11}$, $O^{17}$, $Na^{23}$, and $Al^{27}$. These cases correspond primarily to second order quadrupole broadening. Broadening due to second order dipole-dipole 56 dipole interactions and susceptibility anisotropy can also contribute to the observed frequency dispersion in magic angle spinning of the spin one half nuclei, e.g., $C^{13}$ mentioned above. When such physical effects are present, more than one of the spherical harmonic terms are important. Although spinning the sample at the magic angle provides some improvement in these cases, the resultant spectra are still too broad to provide all the data sought in NMR measurements based thereon.

The present invention provides improved line widths by utilizing an $\Omega(t)$ having the property that the average value of each of the spherical harmonic functions in two sets of said spherical harmonics is zero for all m values. That is, the sample holder 710 is caused to move such that $\Omega$ becomes a function of time, $\Omega(t)$, where $\Omega(t)$ satisfies $$<Y_{pm}(\Omega(t))> = 0 \text{ for } m = -p \text{ to } +p \text{ and} \quad (6)$$

$$<Y_{qm}(\Omega(t))> = 0 \text{ for } m = -q \text{ to } +q.$$

Here, p is different from q and both p and q are greater than zero. In the case in which line broadening due to second order dipole - dipole interactions and susceptibility anisotropy are to be eliminated, p=2 and q=4. However, it will be apparent to those skilled in the art that other values of p and q may be chosen to eliminate other second order line broadening.

The above cited co-pending U.S. Patent application teaches an apparatus and method that provides a major reduction in frequency dispersion even when two or more of the terms in Eq. (3) are significant. The apparatus in question utilizes a more complex pattern of motion so as to enable a more averaged measurement of the frequency of electromagnetic energy absorbed or emitted by each particle in an orientationally disordered sample. The pattern of motion described in this co-pending application satisfies Eq. (6). Unfortunately, this apparatus requires that the sample be moved over $\Omega(t)$ in a time which is short compared to the NMR relaxation time. Such rapid motion increases the cost and complexity of the apparatus and introduces artifacts such as the side-bands discussed above.

The present invention utilizes a pattern of motion which also satisfies Eq. (6). However, by the use of storage techniques which will be described in detail below, the resulting apparatus does not require that the sample be moved in a time which is small compared to NMR relaxation time.

The present invention may be more easily understood by first considering the manner in which the present invention would be used to measure an NMR spectrum if the apparatus could move the sample in a time which is short compared to the inverse of the NMR frequencies. The manner in which storage techniques can then be incorporated to remove this restriction will be discussed.

Consider a pattern of sample motion in which the sample is contained in a sample holder which "hops" between a plurality of orientations. Such a pattern can be described by a set of orientations $\Omega_i$ and a set of dwell times $T_i$. Here i runs from 1 to N where N is the number of orientations. The orientations $\Omega_i$ specify the angular orientation of the sample holder axis with reference to the direction of the applied magnetic field The orientation of the sample holder and the orientation of the polarization vector of the sample are illustrated in FIG. 2 at various times during the experiment. FIG. 2 consists of a number of pairs of drawings labeled (a)-(f). The top drawing in each pair of drawings illustrates the orientation of the sample holder with reference to the direction of the applied magnetic field. The bottom drawing of each pair illustrates the position of the magnetization vector of the sample with reference to the direction of the applied magnetic field. The applied magnetic field is assumed to be parallel to the z-axis in each of the drawings.

Figure 2A:
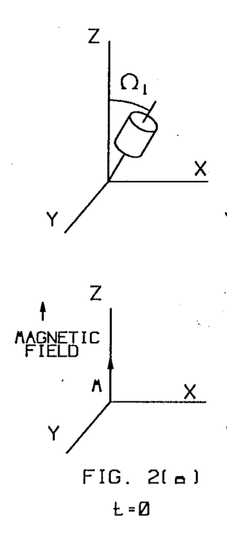
FIG. 2 illustrates the sample and magnetization positions during an ideal NMR experiment.
Figure 2B:
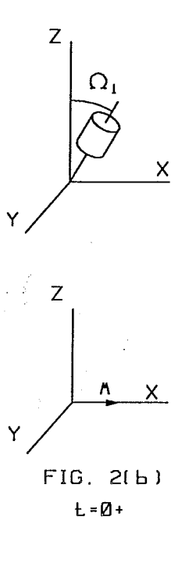

FIG. 2(a) shows these positions at the beginning of the experiment, i.e., at time t=0. At this time, the sample holder orientation is $\Omega_1$, and the magnetization vector, M, is along the z-axis. At t=0, an RF pulse is applied to the sample which causes the magnetization vector to rotate about the y-axis such that it is located along the x-axis as shown in FIG. 2(b), which illustrates the sample and M positions at t=0+. The axis about which the M rotates is determined by the phase of the RF signal. In conventional NMR spectrometers, the RF coil is connected to a drive circuit which includes x and y inputs. The phase of the RF signal is specified by the ratio of the signals connected to said x and y inputs. For example, if a signal having only an x-component is inputted, M will rotate about the y-axis.

Figure 2C:
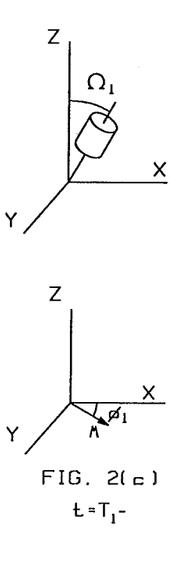

The position of the sample holder remains at $\Omega_1$ for a time $T_1$. During the course of the experiment, M precesses about the z-axis. By time $t=T_1-$, M will have precessed through an angle $\phi_1$ as shown in FIG. 2(c).

Figure 2D:
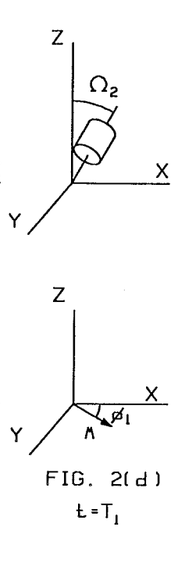
Figure 2E:
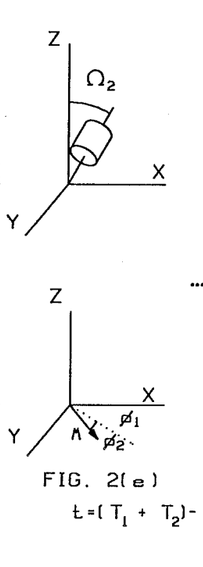

At $t=T_1$, the sample holder is "instantaneously" moved such that its new orientation is $\Omega_2$ as shown in FIG. 2(d). The sample holder remains at $\Omega_2$ for a time interval $T_2$. During this time interval, the magnetization vector, M, continues to precess. By $t=(T_1+T_2)-$, M will have precessed through a further angle $\Omega_2$ as shown in FIG. 2(e). At $t=(T_1+T_2)$ The sample holder is again moved, this time to $\Omega_3$.

Figure 2F:
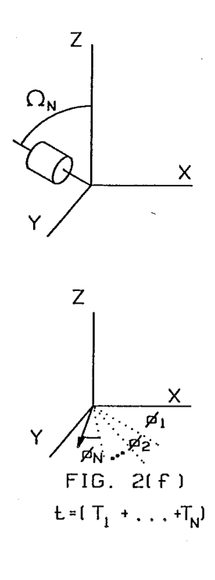

This process of hopping the sample holder at the end of each time interval is repeated until the sample holder has been moved to $\Omega_N$ and a time interval $T_N$ has elapsed. At this point, the position of the sample holder and magnetization vector will be as shown in FIG. 2(f). The magnetization vector will have precessed through an angle $\phi=\phi_1+\phi_2+\ldots+\phi_N$.

The position of the magnetization vector at the end of the experiment may be determined by measuring the signal in the RF coil. This signal is outputted from the same x and y inputs used to pulse the sample at the beginning of the experiment. The x and y signals so measured are proportional to $M\cos(\phi)$ and $M\sin(\phi)$, respectively. These outputs will be referred to as the x and y outputs, respectively.

It is known to those skilled in the NMR arts that $$\phi = \omega T \quad (7)$$

where $T=T_1+T_2+\ldots+T_N$. In an apparatus and method according to the present invention, the $\Omega_i$'s and $T_i$'s are chosen such that Eq. (6) is satisfied. This will be the case if $$\sum_{i=1}^{N} T_i Y_{pm}(\Omega_i) = 0 \text{ for } m = -p \text{ to } +p \quad (8)$$

and $$\sum_{i=1}^{N} T_i Y_{qm}(\Omega_i) = 0 \text{ for } m = -q \text{ to } +q$$

where p is different from q and both p and q are greater than 0. In the preferred embodiment of the present invention, p=2 and q=4. As noted above, the main contributions to the line broadening resulting from second order dipole - dipole interactions and susceptibility anisotropy are to be eliminated in this case.

For the case of p=2 and q=4, the minimum number of angles needed to satisfy Eq. (8) is 6. In this case, $T_1=T_2=\ldots=T_6=T$. That is, equal dwell times are used at each sample orientation. The angles in question correspond to the orientations assumed by the sample axis if it were to point to each of the vertices of an icosahedron centered at the origin. The first orientation corresponds to the sample axis lying along the z-axis, i.e., the direction of the magnetic field. The remaining five orientations correspond to the sample axis being at an angle of 63.43 degrees with respect to the magnetic field direction. The orientations correspond to five equally spaced orientations on a cone having its axis coincident with the z-axis and an opening angle of 2.6343.

If $\omega_0$ were a constant, a single measurement of $\phi$ would be sufficient. However, if there is more than one line in the NMR spectrum, a series of different measurements must be made at different values of T. The complex function $$e^{i\phi(T)} = \cos(\phi(T)) + i[\sin(\phi(T))] \quad (9)$$

is then constructed and the Fourier transform thereof taken. As is well known to those skilled in the NMR arts, the resultant Fourier transformed function is the NMR spectrum.

The above discussion assumed that the sample holder could be hopped between the various locations in a time which is short compared to the inverse of the NMR frequencies being measured. The cost of constructing such an instantaneous hopping apparatus is prohibitive. If the hopping times are long compared to this time, the magnetization vector, M, will have decayed to zero by the time the hop is completed. As a result, no signal will be present at the end of the experiment.

In an apparatus and method according to the preferred embodiment of the present invention, the decay of the magnetization vector is avoided by effectively storing the magnetization vector during the time the sample holder is being moved between successive positions.

The method in which the present invention operates may be most easily underst with reference to a simple NMR experiment in which the sample holder hops between two discrete orientations, $\Omega_1$ and $\Omega_2$, and the sample spends equal times at each angle. This NMR experiment will be used to illustrate how the sum of the angles through which the magnetization vector precesses is obtained. In the case of a single hop, two experiments are needed to measure $\phi T$ for each value of T.

The manner in which these two experiments are combined to produce a measurement is most easily understood with reference to FIGS. 3 and 4. These figures are analogous to FIG. 2 in that the top drawing shows the position of the sample holder, and the bottom drawing shows the position of the magnetization vector, M. FIG. 3 illustrates the sample holder axis and magnetization vectors at various times during the first experiment.

FIG. 4 illustrates the sample holder axis and magnetization vectors at various times during the second experiment. The axes of the Cartesian coordinate system and direction of the applied magnetic field are the same as described with reference to FIG. 2 above. At time t=0 an RF pulse is applied to the sample which causes the magnetization vector, M, to tip such that it is now in the xy-plane. The RF pulse is applied by inputting separate x and y signals to the coil control circuit described above. The phase of the RF pulse is adjusted so that the magnetization vector M is initially along th x-axis.

Figure 3A:
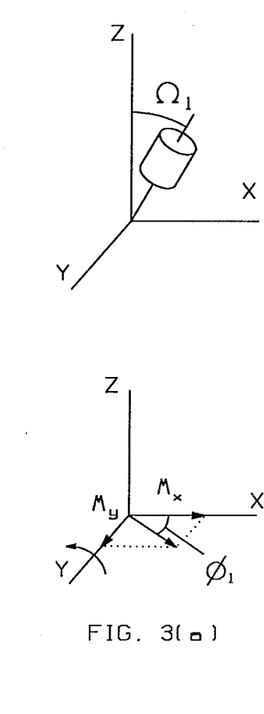
FIG. 3 illustrates the sample holder and sample magnetization positions during the first of two storage experiments.
Figure 3B:
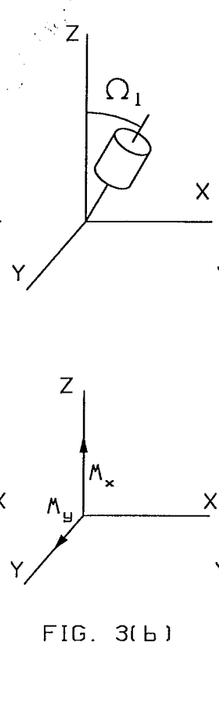

After a time T elapses, M will have precessed through an angle $\phi_1$ as shown in FIG. 3(a). The magnetization vector, M, may be decomposed into components $M_x$ and $M_y$ along the x and y axes, respectively. At this point in time, an RF signal is applied to the coil which causes the magnetization vector to rotate in space. The direction of this rotation is different for each of the experiments. The direction of the rotation is determined by the phase of the applied RF signal. In the first experiment, the axis of rotation is the y-axis. This is the same axis of rotation as that used to tip the magnetization vector away from the z-axis. Hence, a pulse having a phase which differs by 180 degrees from that of the original RF pulse is used. After this rotation, the component of the magnetization that was along the x-axis will now be along the z-axis shown in FIG. 3(b).

Figure 3C:
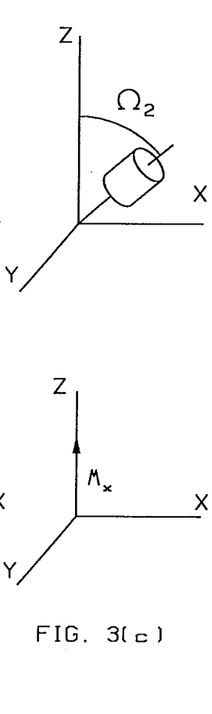
Figure 3D:
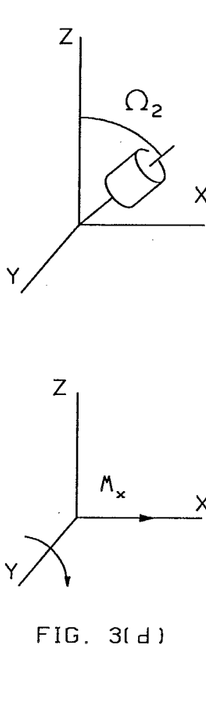

At this point in time, the sample holder is moved to $\Omega_2$. The motion takes a time which is long compared to precession period of the magnetization vector. During this time, the component of the magnetization along the y-axis will have decayed to zero. However, the component along the z-axis will not have decayed because of the laws of quantum mechanics. Hence, after the sample has been moved to $\Omega_2$, the magnetization will be as shown in FIG. 3(c). That is, it will be along the z-axis and have a magnitude equal to that of $M_x$. Next, a third RF pulse is applied to the sample having a phase which is the same as the phase of the first RF pulse. This causes the magnetization to rotate 90 degrees around the y-axis such that it is now aligned with the x-axis as shown in FIG. 3(d).

Figure 3E:
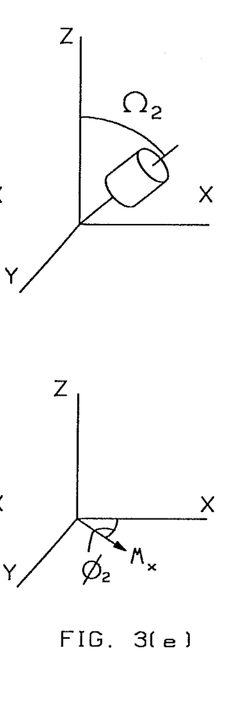

After a further time interval, T, elapses, the magnetization vector will have precessed through an angle $\Omega_2$ as shown in FIG. 3(e). The signals from the x and y outputs of the coil at this point in time will have magnitudes equal to $M_x\cos(\phi_2)$ and $M_x\sin(\phi_2)$, respectively. Since $M_x$ is equal to $M\cos(\phi_1)$, the x and y outputs will have signals equal to $M\cos(\phi_1)\cos(\phi_2)$ and $M\cos(\phi_1)\sin(\phi_2)$, respectively.

FIG. 4 illustrates the sample axis and magnetization vectors at various times during the second experiment. At time t=0 an RF pulse is applied as in the first experiment. The magnetization vector, M, after this pulse, lies along the x-axis as in the first experiment.

Figure 4A:
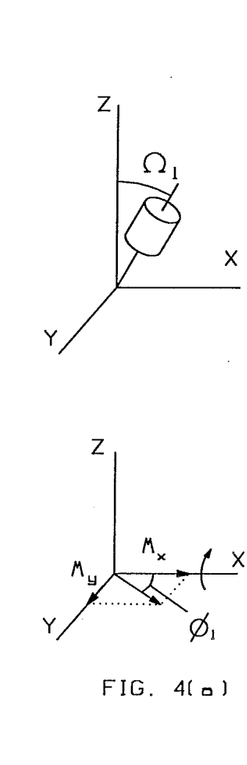
FIG. 4 illustrates the sample holder and sample magnetization positions during the second of two storage experiments.
Figure 4B:
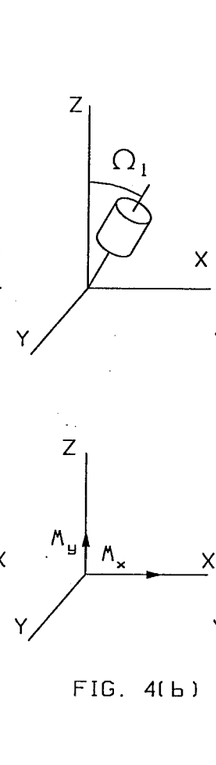

After a time T has elapsed, M will have again precessed through an angle $\phi_1$ as shown in FIG. 4(a). At this point in time, an RF signal is applied to the coil which causes the magnetization vector to rotate about the x-axis. This is accomplished by applying an RF pulse which differs in phase by 90 degrees from that used to rotate the magnetization about the y-axis. After this rotation, the component of the magnetization that was along the y-axis will now be along the z-axis shown in FIG. 4(b).

Figure 4C:
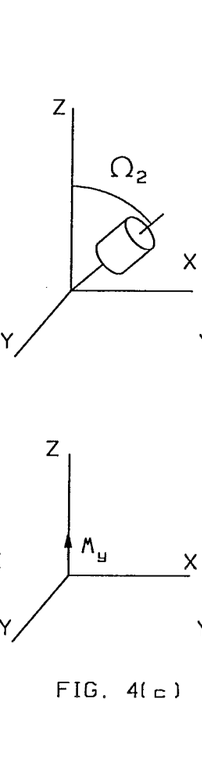
Figure 4D:
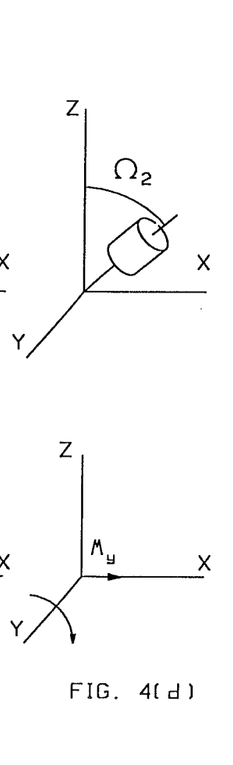

The sample holder is then moved to $\Omega_2$. The movement takes a time which is long compared to precession period of the magnetization vector. During this time, the component of the magnetization along the x-axis will have decayed to zero, leaving only the component along the z-axis, as shown in FIG. 4(c). A third RF pulse is then applied to the sample having a phase which is the same as the phase of the first RF pulse. This causes the magnetization to rotate 90 degrees around the y-axis such that it is now aligned with the x-axis as shown in FIG. 4(d). The magnitude of the magnetization vector will now be $M_y$.

Figure 4E:
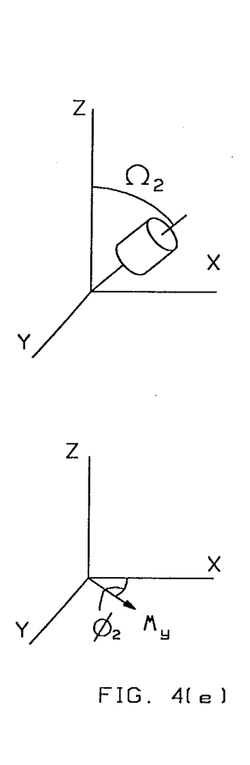

After a further time interval, T, has elapsed, the magnetization will have precessed through an angle $\phi_2$ shown in FIG. 4(e). The signals from the x and y outputs of the RF coil at this point in time will have magnitudes equal to $M_y \cos(\phi_2)$ and $M_y \sin(\Omega_2)$, respectively. Since $M_y$ is equal to $M\sin(\phi_1)$, the x and y outputs will have signals equal to $M\sin(\phi_2) \cos (\phi_2)$ and $M\sin(\phi_1) \sin (\phi_2)$, respectively.

If one sums the x outputs from the two experiments, one obtains $$M\cos(\phi_1) \cos (\phi_2) + M\sin(\phi_1) \cos (\phi_2) = M\cos(\phi_1 + \phi_2). \quad (10)$$

Similarly, the sum of the y outputs is $$M\cos(\phi_1) \sin (\phi_2) + M\sin(\phi_1) \sin (\phi_2) = M\sin(\phi_1 + \phi_2). \quad (11)$$

Given this background, the manner in which storage experiments may be used to calculate $e^{i\phi}$ where $$\phi = \sum_{i=1}^{N} \phi_i$$

will now be discussed. If N orientations $\Omega_i$ are needed to satisfy Equation (8), then N−1 changes in position will be needed. At each change in position, either the x or y component of the magnetization vector as it existed just prior to the change in position can be stored. Hence, any given storage experiment can be specified by specifying the component of the magnetization vector which was stored prior to each of the changes in position.

At the end of each possible storage experiment, i.e., after the sample has spent a time $T_N$ at $\Omega_N$, the signals from the x and y output of the RF coil are measured. The signal from the x output will be $$\prod_{i=1}^{N-1} F_i(\phi_i)\cos(\phi_N) \quad (12)$$

and the signal from the y output will be $$\prod_{i=1}^{N-1} F_i(\phi_i)\cos(\phi_N) \quad (13)$$

where $F_i(x) = \cos (x)$ if the x-component of the magnetization vector was stored at the ith position change, and $F_i(x) = \sin (x)$ if the y-component of the magnetization was stored at the ith position change. Since there are N−1 changes in position, there are $2^{N-1}$ possible storage experiments in which each experiment produces two terms of the type shown in Equations (12) and (13). Hence, by performing all of the possible storage experiments, all terms of the form $\Pi F_i(\phi_i)$, where $F_i$ is either a sine or cosine, can be measured.

It will be apparent to those skilled in the mathematical arts that $e^{i\phi}$ can be expanded as follows:

$$e^{i\phi} = \sum_{i=1}^{N} R_i \prod_{j=1}^{N} {}^iF_j(\phi_i) \quad (14)$$

where ${}^iF_j$ is either a sine or a cosine and the $R_i$ terms are constants. There are $2^N$ terms in Equation (14). These are precisely the $2^N$ terms obtained from the various storage experiments. Hence, by performing all possible storage experiments, one can obtain the value of $e^{i\phi}$. If $e^{i\phi}$ is then measured for different values of T, and the Fourier transform thereof taken, the desired NMR spectrum can be determined.

An apparatus for accomplishing the positional changes described above is illustrated in FIG. 5 at 400. Apparatus 400 is placed in a constant magnetic field having a direction shown at 401. For simplicity, the magnet used for generating this magnetic field has been omitted from the drawing.

Figure 5:
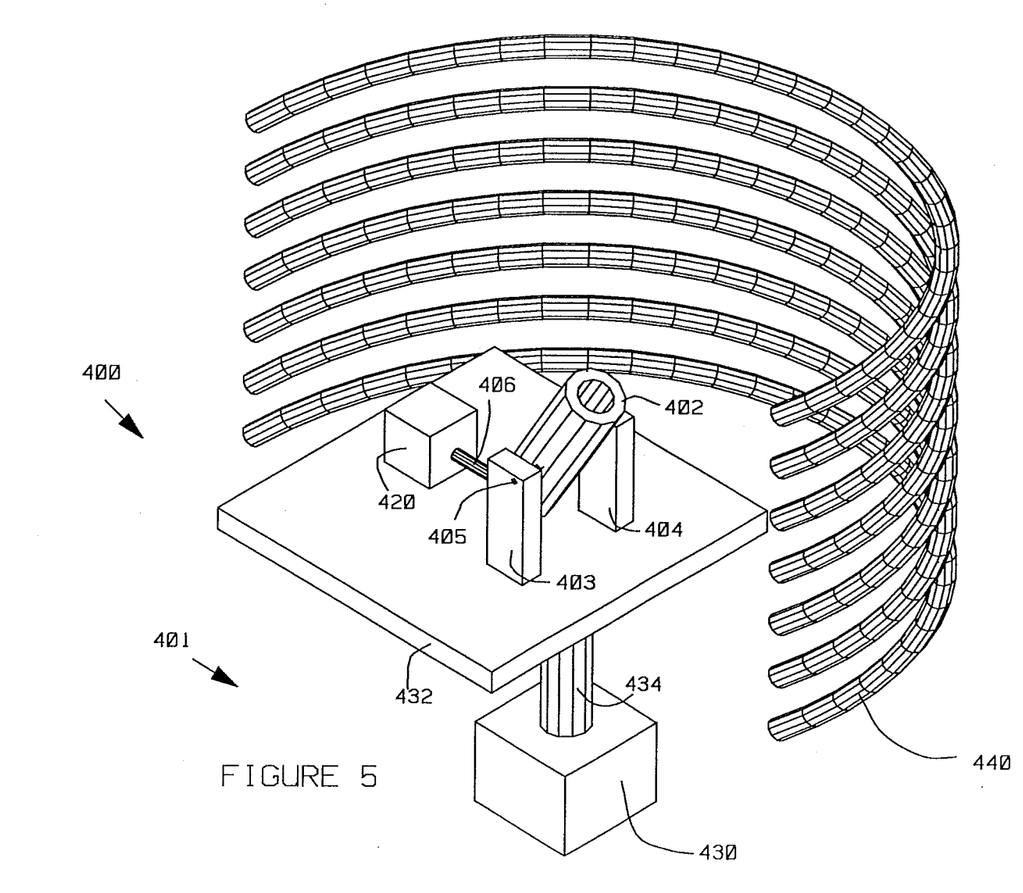
FIG. 5 is a partially cut-away prospective view of a apparatus according to the present invention.

The material to be studied is placed inside sample holder 402. Sample holder 402 is mounted between supports 403 and 404 such that it is free to move about pin hinge 405. The angle between the axis of sample holder 402 and the magnetic field direction is controlled by a first actuator 420 which is hingedly connected to the bottom of sample holder 402 by rod 406. Actuator 420 is preferably a pneumatically operated linear actuator.

The orientation of sample holder 402 relative to the x and y axes is controlled by a second actuator shown at 430. Supports 403 and 404 are mounted on a table 432 which is in turn mounted on shaft 434. Actuat 430 is used to rotate table 432 about shaft 434 which determines the orientation of sample holder 402 relative to the x and y axes.

The sample holder 402 is located within RF coil 440. A portion of RF coil 440 has been cut away for clarity. Although RF coil 440 is shown in a fixed position relative to sample holder 402, it will be apparent to those skilled in the art that RF coil 440 could be replaced by a coil surrounding sample holder 402 and moving therewith. Such a coil would provide increased signal to noise ratio. If such a coil were used, the signals therefrom would need to be corrected for the change in coil orientation during the experiment.

Accordingly, a novel method and apparatus for measuring the NMR spectra of solids and the like has been described. Various modifications to the present invention will become apparent to those skilled in the art from the foregoing description and accompanying drawings. Accordingly, the present invention is to be limited solely by the scope of the following claims.

What is claimed is:

1. An apparatus for measuring the NMR spectra of a sample, said apparatus comprising:

means for holding said sample in a magnetic field, the orientation of said sample being specified by a set of angles, $\Omega$, said set of angles being measured with reference to the direction of said magnetic field; and orientation means for causing the orientation of said sample to assume a succession of discrete orientations relative to said magnetic field direction, the ith said orientation being specified by a set of angles $\Omega_i$, where i runs from 1 to N, the time spent at $\Omega_i$ being $T_i$, wherein $$\sum_{i=1}^{N} T_i Y_{pm}(\Omega_i) = 0 \quad \text{for } m = -p \text{ to } +p$$

and $$\sum_{i=1}^{N} T_i Y_{qm}(\Omega_i) = 0 \quad \text{for } m = -q \text{ to } +q.$$

and wherein $Y_{pm}$ and $Y_{qm}$ are generalized spherical harmonic functions of order p and q, respectively, p and q being greater than 0 and different from each other.

2. The apparatus of claim 1 wherein p=2 and q=4.

3. The apparatus of claim 2 wherein N=6 and $T_i$=T, a constant, for i=1 to 6.

4. A method for measuring the NMR spectra of a sample, comprising the steps of:

placing said sample in a magnetic field, the orientation of said sample being specified by a set of angles, $\Omega$, said set of angles being measured with reference to the direction of said magnetic field; and causing the orientation of said sample to assume a succession of discrete orientations relative to said magnetic field direction, the ith said orientation being specified by a set of angles $\Omega_i$, where i runs from 1 to N, the time spent at $\Omega_i$ being $T_i$, wherein $$\sum_{i=1}^{N} T_i Y_{pm}(\Omega_i) = 0 \quad \text{for } m = -p \text{ to } +p$$

and $$\sum_{i=1}^{N} T_i Y_{qm}(\Omega_i) = 0 \quad \text{for } m = -q \text{ to } +q.$$

and wherein $Y_{pm}$ and $Y_{qm}$ are generalized spherical harmonic functions of order p and q, respectively, p and q being greater than 0 and different from each other.

5. The method of claim 4 wherein p=2 and q=4.

6. The method of claim 5 wherein N=6 and $T_i$=T, a constant, for i=1 to 6.

* * * * *

UNITED STATES PATENT AND TRADEMARK OFFICE
CERTIFICATE OF CORRECTION

PATENT NO. : 4,968,939

DATED : November 6, 1990

INVENTOR(S) : Pines, et al.

It is certified that error appears in the above-identified patent and that said Letters Patent is hereby corrected as shown below:

Column 1, Line 1, insert --This invention was made in the course of, or under, contract DE-AC-03-765SF00098 between the United States Department of Energy and the University of California for the operation of the Lawrence Berkeley Laboratory--.

Column 5, Line 46-48, delete "1's" and insert therefor --$\ell$--.

Column 6, Line 36, delete "1" and insert therefor --$\ell$--.

Column 9, Line 52, delete "underst" and insert therefor --understood--.

Column 10, Line 13, delete "th" and insert therefor --the--.

Column 10, Line 31, insert "as" therefor before --shown--.

Column 10, Line 50, delete "$\Omega_2$" and insert therefor --$\phi_2$--.

Column 11, Line 5, insert "as" therefor before --shown--.

Column 11, Line 24, insert "as" therefor before --shown--.

Column 12, Line 15, delete "form II" and insert therefor --form $\pi$--.

UNITED STATES PATENT AND TRADEMARK OFFICE
CERTIFICATE OF CORRECTION

PATENT NO. : 4,968,939
DATED : November 6, 1990
INVENTOR(S) : Pines, et al.

It is certified that error appears in the above-identified patent and that said Letters Patent is hereby corrected as shown below:

Column 12, line 54, delete "Actuat" and insert therefor --Actuator--.

Signed and Sealed this

Seventh Day of July, 1992

*Attest:*

DOUGLAS B. COMER

*Attesting Officer*     *Acting Commissioner of Patents and Trademarks*

UNITED STATES PATENT AND TRADEMARK OFFICE
CERTIFICATE OF CORRECTION

PATENT NO. : 4,968,939

DATED : November 6, 1990

INVENTOR(S) : Pines, *et al.*

It is certified that error appears in the above-identified patent and that said Letters Patent is hereby corrected as shown below:

Column 1, line 15, after line 15 insert the paragraph --This invention was made in the course of, or under, contract DE-AC-03-76SF00098 between the United States Department of Energy and the University of California for the operation of the Lawrence Berkeley Laboratory.
--.

Signed and Sealed this

Sixth Day of July, 1993

*Attest:*

MICHAEL K. KIRK

*Attesting Officer*  *Acting Commissioner of Patents and Trademarks*